United States Patent
Hayashi et al.

(10) Patent No.: US 6,780,278 B2
(45) Date of Patent: Aug. 24, 2004

(54) PLASMA PROCESSING APPARATUS WITH REDUCED PARASITIC CAPACITY AND LOSS IN RF POWER

(75) Inventors: Hisataka Hayashi, Kanagawa-ken (JP); Kazuhiro Tomioka, Kanagawa-ken (JP); Itsuko Sakai, Kanagawa-ken (JP); Tokuhisa Ohiwa, Kanagawa-ken (JP); Akihiro Kojima, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 296 days.

(21) Appl. No.: 09/892,481

(22) Filed: Jun. 28, 2001

(65) Prior Publication Data

US 2002/0042204 A1 Apr. 11, 2002

(30) Foreign Application Priority Data

Jun. 28, 2000 (JP) ........................... P2000-195165

(51) Int. Cl.$^7$ .............................................. H01L 21/00
(52) U.S. Cl. ............................... 156/345.47; 118/723 E
(58) Field of Search ............... 118/723 E; 156/345.43, 156/345.44, 345.45, 345.46, 345.47; 315/111.21; 438/710; 216/67

(56) References Cited

U.S. PATENT DOCUMENTS

| | | | | |
|---|---|---|---|---|
| 5,147,497 A | * | 9/1992 | Nozawa et al. | ................ 216/61 |
| 5,255,153 A | * | 10/1993 | Nozawa et al. | ............. 361/234 |
| 5,269,881 A | * | 12/1993 | Sekiya et al. | ................ 134/1.1 |
| 5,665,166 A | * | 9/1997 | Deguchi et al. | .......... 118/723 E |
| 5,685,949 A | * | 11/1997 | Yashima | ...................... 438/694 |
| 6,120,661 A | * | 9/2000 | Hirano et al. | ........... 204/298.15 |

FOREIGN PATENT DOCUMENTS

JP  11-251302  9/1999

* cited by examiner

*Primary Examiner*—Gregory Mills
*Assistant Examiner*—Michelle Crowell
(74) *Attorney, Agent, or Firm*—Finnegan, Henderson, Farabow, Garrett & Dunner, L.L.P.

(57) ABSTRACT

A plasma processing apparatus comprises a grounded housing, a thin RF plate electrode, an opposite electrode facing the RF plate electrode, and a RF power source for applying a radio frequency to either the RF plate electrode or the opposite electrode to produce plasma between the two electrodes. If the radio frequency applied to the electrode is f (MHz), the parasitic capacity C (pF) between the grounded portion of the housing and a conductive portion through which the radio frequency propagates is less than $1210*f^{-0.9}$. The thickness of the RF plate electrode is 1 mm to 6 mm, and it is supported by a heat sink. The heat sink has a coolant passage in the proximity to the RF plate electrode. The heat sink also has a groove or a cavity in addition to the coolant passage, thereby reducing the value of the dielectric constant of the heat sink as a whole.

16 Claims, 9 Drawing Sheets

PLASMA PROCESSING APPARATUS WITH REDUCED PARASITIC CAPACITY AND LOSS IN RF POWER

The present patent application claims the benefit of earlier Japanese Patent Application No. 2000-195165 filed Jun. 28, 2000, the disclosure of which is herein incorporated entirely by reference.

BACKGROUND OF THE INVENTION

1. Field of the Invention

The present invention relates to a plasma processing apparatus for producing plasma under application of a radio frequency and for carrying out etching or CVD processes.

2. Description of the Related Art

A parallel plate type plasma etching apparatus is generally used in semiconductor manufacturing processes. In the conventional plasma etching apparatus, a radio frequency of about 13.56 MHz is applied to the cathode electrode to excite plasma. However, in order to keep up with increasingly strict design rules, and in order to respond to a demand for improvements in productivity, techniques of applying a higher range of radio frequency, e.g., the frequency band of VHF to UHF have been studied. The proposal of raising the radio frequency applied to the electrode also responds to a demand for an increase in wafer size, in which more intricate patterns are to be formed.

However, as the frequency applied to the electrode becomes higher, the loss of RF power also increases. If the loss of RF power increases, the electron density of plasma produced between the parallel plate electrodes decreases, lowering the etching rate. Consequently, a wafer cannot be precisely etched into a designed shape and pattern.

FIG. 1 illustrates a conventional plasma processing apparatus. The conventional apparatus comprises an RF electrode 4, to which an RF is applied, and a metallic DC plate 2, to which a direct-current voltage is applied, a ceramic or resin insulator 3a, and an opposite electrode 5 facing the RF electrode. The conventional RF electrode 4 is made relatively thick because the RF electrode itself has a wafer support function. The RF electrode 4, the DC plate 2, and the insulator 3a and 3b constitute a wafer hold structure.

As illustrated in FIG. 2, pusher pins 12 extend penetrating the RF electrode 4, the DC plate 2 and the insulator 3b. The pusher pins 12 are used to place a wafer 1 onto the RF electrode 4. When the wafer 1 is transported into the housing 7, the pusher pins 12 elevate and project above the RF electrode 4 to receive the wafer 1. Then, the pusher pins 12 are lowered to place the wafer 1 onto the insulator 3b.

The wafer 1 is securely held on the RF plate 4 by an electrostatic chuck consisting of the insulator 3b and the DC plate 2. A positive voltage of 1000V to 3000V is applied to the DC plate 2 from the DC power source 11. In this situation, if a radio frequency is applied to the RF electrode 4 to produce plasma, the wafer 1 is charged up negatively and attracted to the DC plate 2 that is at a positive voltage. A low pass filter 13 prevents the RF power, which is applied to the RF electrode 4 and transferred to the DC plate 2 via the parasitic capacity between the RF electrode 4 and the DC plate 2, from flowing into the DC power source 11.

In the conventional plasma processing apparatus shown in FIGS. 1 and 2, as the radio frequency applied to the electrode is raised, loss due to the inductance and the parasitic capacity of the hot lines becomes large. This means that the loss of the RF power also increases.

The most significant example of loss due to the raised radio frequency is the growth in parasitic capacity relative to the capacity of produced plasma. To be more precise, as the radio frequency becomes higher, the plasma density increases, as illustrated in FIG. 4B. On the contrary, the plasma capacity itself abruptly decreases as the frequency increases, as shown in FIG. 4A. For this reason, the parasitic capacity existing between the RF supply line through which the radio frequency propagates and the grounded portion of the housing 7 becomes almost equal to the plasma capacity (that is, the parasitic capacity increases relatively). This means that, apart from that used for producing and maintaining plasma, the RF power supplied to the apparatus is wasted.

Another problem in the conventional plasma processing apparatus is the parasitic capacity existing between the RF mount electrode 4 and the pusher pins 12. As is illustrated in FIG. 2, the conventional RF mount electrode 4 is made relatively thick because it is designed to function as both an electrode and a wafer mount stage. The pusher pins 12 always face the metallic electrode 4 even after it retreats inside the RF mount electrode 4, producing parasitic capacity between the pins and electrode 4. This parasitic capacity causes a loss in RF power.

Such a loss becomes particularly marked if the applied radio frequency is 60 MHz or higher. Accordingly, the reduction of parasitic capacity is one of the most serious problems to be solved. In order to reduce the parasitic capacity, the entire apparatus, including the heat sink structure and pusher pin arrangement, must be configured optimally.

Still another problem in the conventional apparatus is the loss of RF power from the electrostatic chuck. As has been mentioned above, the radio frequency applied to the RF mount electrode flows into the low pass filter 13 via the DC transmission line, and is consumed in this filter. This occurs because the low pass filter 13 consists of lumped-constant reactance elements, and has large parasitic capacity. As the radio frequency becomes higher, loss or the consumption in the low pass filter 13 increases. The radio frequency flowing into the low pass filter 13 may cause the break down or burning of the low pass filter, and may damage the DC power source 11.

On the other hand, it is desirable to reduce the volume of the housing 7 as much as possible in order to produce plasma efficiently, while reducing the quantities of precursor gases introduced into the apparatus. To reduce the volume of the apparatus, it has been proposed to use the heat sink (or insulator) that supports the RF electrode and a wafer as a vacuum chuck itself. However, the interface between the metallic housing and the ceramic sink is located at the boundary between the vacuum and the atmosphere. Consequently, the heat sink becomes brittle and is likely to break.

SUMMARY OF THE INVENTION

Therefore, to overcome the problems in the prior art technique, a plasma processing apparatus that can reduce a loss of RF power even if a radio frequency of 60 MHz or higher is applied to the electrode is provided in one aspect of the invention. In this apparatus, the plasma capacity is increased relative to the parasitic capacity by reducing the parasitic capacity of the apparatus as a whole. This plasma processing apparatus comprises a grounded housing, a thin RF plate electrode placed in the housing, an opposite electrode facing the RF plate electrode, and an RF power source for applying a radio frequency to either the RF plate electrode or the opposite electrode. By applying a radio frequency to either electrode, plasma is produced between the RF plate electrode and the opposite electrode. If the radio frequency applied to the electrode is f (MHz), the parasitic capacity C (pF) between the grounded portion of the housing and a conductive portion through which the radio frequency propagates is less than $1210*f^{-0.9}$.

In another aspect of the invention, a plasma processing apparatus comprises a grounded housing, an RF plate electrode placed in the housing, an opposite electrode facing the RF plate electrode, and first and second radio-frequency power sources. The first and second radio-frequency power sources apply different values of radio frequencies to either the RF plate electrode or the opposite electrode. One of the radio frequencies applied to the electrode is 60 MHz or higher. If this radio frequency is f (MHz), the parasitic capacity C (pF) between the grounded portion of the housing and a conductive portion (or hot lines) is also less than $1210*f^{-0.9}$.

In still another aspect of the invention, a plasma processing apparatus having an improved pusher pin structure for reducing the parasitic capacity is provided. In this apparatus, the parasitic capacity between the RF plate electrode, to which a radio frequency is applied, and pusher pins is substantially eliminated, thereby greatly reducing the loss of RF power. This plasma processing apparatus comprises a grounded housing, a wafer mount electrode having at least two holes passing through it, an opposite electrode facing the wafer mount electrode, an RF power source, and pusher pins inserted in the holes. The wafer mount electrode includes an RF plate electrode having a thickness of 6 mm or less and an insulator for supporting the RF plate electrode. The pusher pins are movable between a first position, at which the pusher pins project out of the wafer mount electrode to receive a wafer, and a second position, at which the pusher pins retreat below the RF plate electrode during the generation of plasma.

In yet another aspect of the invention, a plasma processing apparatus that can reduce the loss of RF power, eliminate adverse influence to the DC power source, and produce plasma at a high density, is provided. This plasma processing apparatus comprises a wafer mount electrode, an opposite electrode facing the wafer mount electrode, a DC power source, and RF power source, and a radio-frequency trap positioned between the wafer mount electrode and the DC power source. The DC power source supplies a direct-current voltage to hold a wafer on the wafer mount electrode in an electrostatic manner. The RF power source applies a radio frequency to either the wafer mount electrode or the opposite electrode to generate plasma between the two electrodes. The radio-frequency trap has an electrical length of (2n+1)/4 wavelength of the applied radio frequency, where n is 0 or a natural number.

BRIEF DESCRIPTION OF THE DRAWINGS

Other objects and advantages will be apparent from the following detailed description of the invention in conjunction with the attached drawings, in which.

DESCRIPTION OF THE EMBODIMENTS (First Embodiment)

Figure 3:
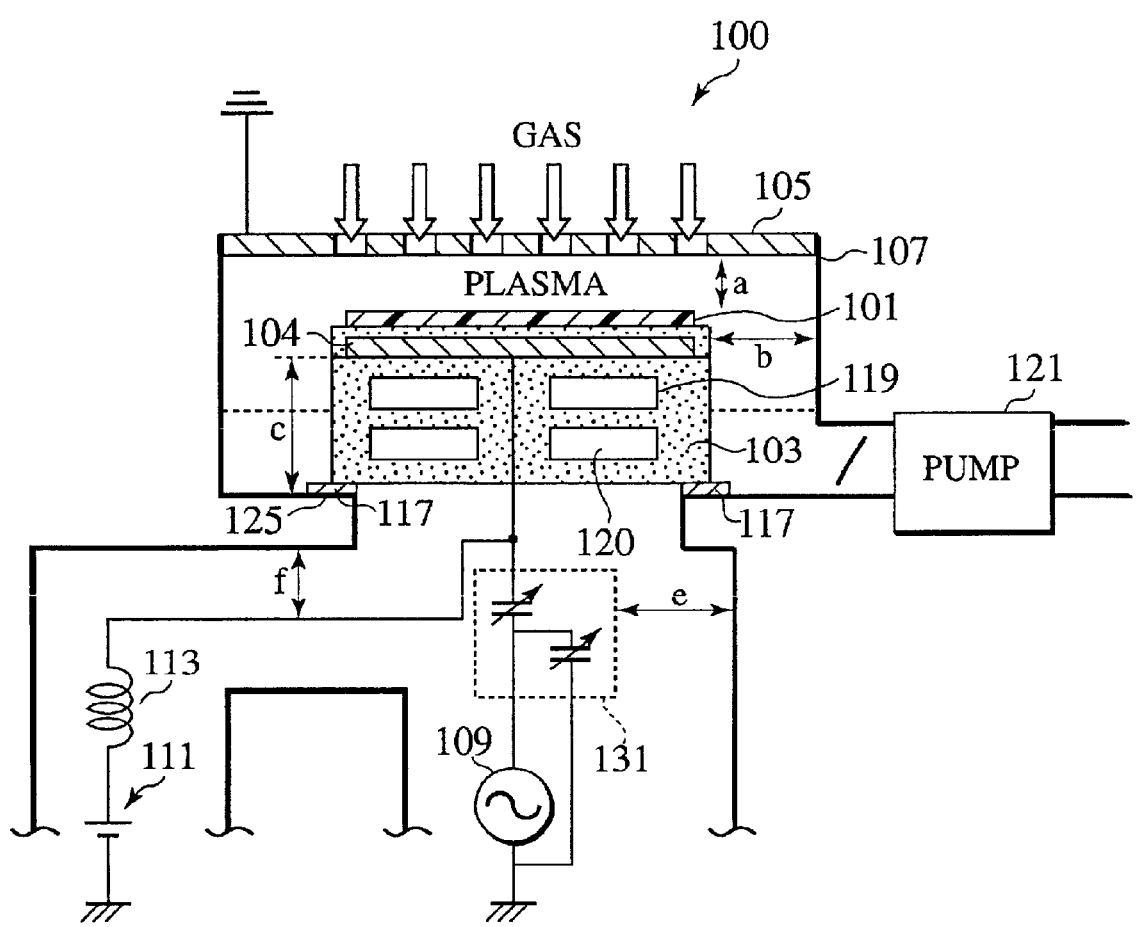
FIG. 3 illustrates a plasma processing apparatus according to the first embodiment of the invention.

FIG. 3 illustrates a plasma processing apparatus 100 according to the first embodiment of the invention. The plasma processing apparatus 100 has housing 107, a thin RF plate electrode 104 placed in the housing, and an opposite electrode 105 facing the RF plate electrode 104. The apparatus also has a heat sink 103 holding the RF plate electrode 104, and an RF power source 109 for applying a radio frequency to at least one of the RF plate electrode 104 and the opposite electrode to produce plasma between these two electrodes. A matching box 131 is inserted between the RF power source 109 and the load to cancel the reactance component of the load and correct the impedance.

The RF plate electrode has a thickness of 6 mm or less, and more preferably, 1 mm to 3 mm, which is relatively thin as compared with the conventional RF electrode. The thin RF plate electrode 104 is held on the heat sink 103, which regulates the temperature of a wafer that is to be processed. The heat sink 103 is, for example, a cylinder made of ceramics, and has a coolant passage 119. The coolant passage 119 is located just under the RF plate electrode 104 to regulate the temperature of a wafer 101 during plasma processing. To carry out plasma processing with high precision, the wafer temperature must be kept uniform.

In addition to the coolant passage 119, a groove 120 is formed in the heat sink 103. By forming the coolant passage 119 and the groove 120, the dielectric constant of the heat sink 103 can be reduced as a whole, and consequently, the parasitic capacity existing in the housing 107 decreases. The coolant passage 119 and the groove 120 are annular or curved.

The heat sink 103 is secured at the bottom edge on the shoulder 125 of the housing 107. The diameter of the housing 107 becomes smaller at the shoulder 125. By mounting the heat sink 103 on the shoulder 125 of the housing 107, a vacuum chamber is formed in the upper part of the housing 107. Thus, the heat sink 103 functions as a vacuum chuck. From its bottom face, the heat sink 103 is in contact with the atmosphere.

In general, if the interface between the grounded housing 107, which is made of a conductive material, and the heat sink 103, which is made of a ceramic material, is located at the boundary between the vacuum and the atmosphere, the heat sink is likely to break or crack. To prevent such damage, a shock absorber 117 is inserted between the heat sink 103 and the housing 107. The shock absorber 117 is made of a soft and malleable insulator, such as Teflon. By inserting a shock absorber between the housing (i.e., the conductor) and the heat sink (i.e., the insulator, such as ceramics), the heat sink is protected from breakage even if it is located at the boundary between the vacuum and the atmosphere.

As a feature of the plasma processing apparatus, if the radio frequency applied to the RF plate electrode 104 is f (MHz), the parasitic capacity C (pF) existing in the housing is less than $1210*f^{-0.9}$. By limiting the parasitic capacity to this value, the plasma capacity is increased relative to the parasitic capacity, and as a result, the plasma density can be increased.

Figure 4A:
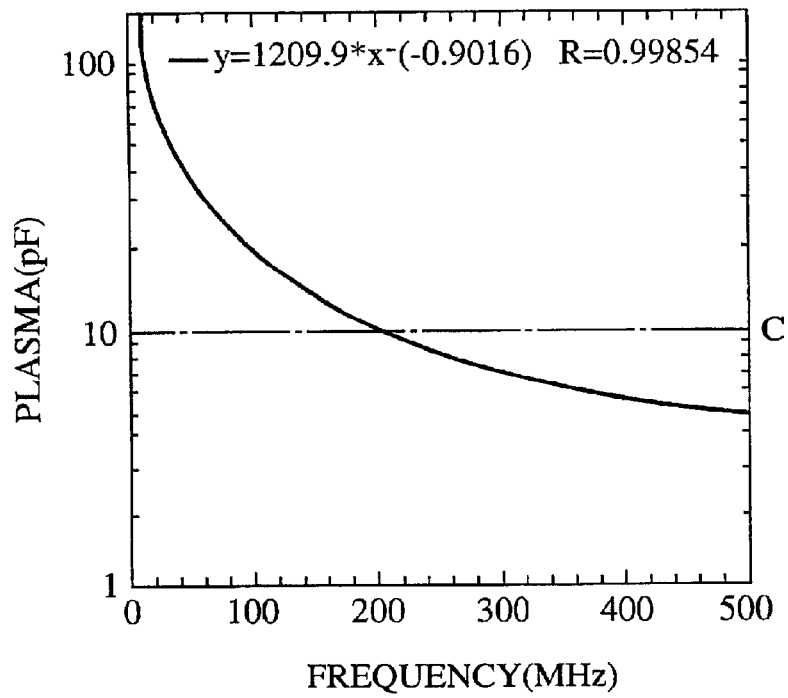
FIG. 4A is a graph showing the plasma capacitance as a function of frequency applied to the plasma processing apparatus.

This concept will be explained with reference to FIGS. 4A and 4B. FIG. 4A is a graph of the plasma capacity (pF) as a function of the radio frequency f (MHz) applied to the RF plate electrode 104 shown in FIG. 3. As is clearly shown in the graph, as the radio frequency applied to the electrode is raised, the plasma capacity abruptly decreases. The relation between the plasma capacity and the applied frequency is $$C(pF) = 1209.9 \times f^{-0.9016}. \tag{1}$$

It is generally convinced that as the applied radio frequency becomes higher, the electron density in the produced plasma increases. The general understanding was that electron density is in proportion to the square of the applied frequency, and therefore, it was believed that plasma processing could be carried out more efficiently by the application of higher RF power.

However, in reality, the produced plasma capacity decreases at higher frequency, as is shown in FIG. 4A. If the parasitic capacity of the circuit (that is, the capacity generated between the ground and the conductive passes through which the radio frequency propagates) is, for example, about 10 pF as indicated by the dashed line C in FIG. 4A, then, the produced plasma capacity becomes almost equal to the parasitic capacity if the applied radio frequency is raised up to 200 MHz. This means that the applied radio frequency is wasted on irrelevant activity other than producing plasma. If the radio frequency is further raised, the produced plasma capacity falls below the dashed line C, which means that the parasitic capacity is greater than the produced plasma capacity.

Figure 4B:
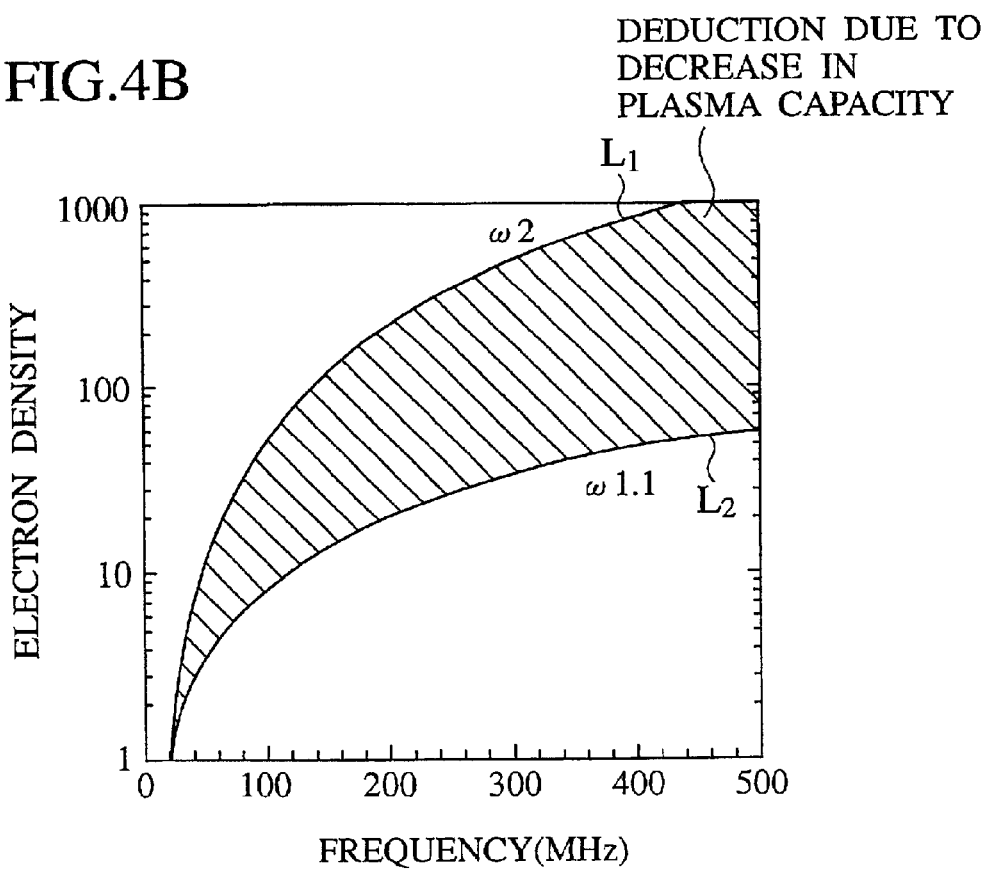
FIG. 4B is a graph showing the theoretical electron density and the actual electron density reflecting decrease in plasma capacitance in the higher frequency range.

FIG. 4B is a graph of electron density as a function of applied frequency in a conventional parallel plate plasma etching apparatus designed for 13.56 MHz. The curved line L1 represents the theoretical value of the electron density, which is in proportion to square of applied frequency ($f^2$). The line L2 represents the actual electron density taking the decrease of produced plasma capacity into account. As has been explained in conjunction with FIG. 4A, the plasma capacity decreases in proportion to $f^{-0.9}$. Accordingly, the plasma density (i.e., the electron density) increases in proportion to power of 1.1 of applied frequency.

In order to guarantee that the increase in electron density is at least in proportion to $f^{1.1}$, the apparatus must be designed so that the parasitic capacity C is kept under $1210 \times f^{-0.9016}$ (pF) even if the applied radio frequency is raised.

The parasitic capacity exists between the hot lines through which the radio frequency propagates and the grounded portion. The hot lines include, for example, the conductive extending from the RF power source 109 to the RF plate electrode 104, and the RF plate electrode itself. To reduce the parasitic capacity, the following measures are taken in the plasma processing apparatus of the first embodiment:

(i) selecting a coolant that has as low a dielectric constant as possible (or at least lower than the dielectric constant of the heat sink 103);
(ii) forming a groove or a capacity in the heat sink 103; and
(iii) setting the dimensions of the elements of the apparatus optimally.

Item (iii) relates to the gap "a" between the opposite electrode 105 and the wafer surface, the space "b" between the edge of the RF plate electrode 104 and the housing 107, the distance "c" from the shoulder 125 to the RF plate electrode 104, and spaces "e" and "f" from the conductive lines to the housing 107 being set optimally.

For example, a 300 mm wafer is processed in the apparatus, and the gap "a" between the opposite electrode 105 and the surface of the wafer 101 is set to 20 mm. Under this condition, it is desirable to have a large space "b" between the edge of the RF plate electrode 104 and the housing 107 in order to reduce the parasitic capacity produced in this portion. However, the space "b" cannot be increased too freely because the apparatus would become huge. Therefore, the space "b" is set to about twice of "a", that is, about 40 mm. The distance "c" from the bottom of the heat sink 103 to the RF plate electrode 104 is set to b* $\in$ r (where $\in$ r is the relative dielectric constant of the heat sink 103).

The parasitic capacity C between the RF plate electrode 104 and the shoulder 125 of the housing 107, at which the heat sink 103 is held, is given by $\in$ S/c (where $\in$ is the dielectric constant of the heat sink 103 and S is the contact area between the bottom of the heat sink 103 and the shoulder 125 of the housing 107). If the distance "c" is set too small, the parasitic capacity becomes large. If the distance "c" is set large, the apparatus become large. For this reason, "c" is set equal to b* $\in_r$ in order to guarantee the mechanical strength of the heat sink 103 even allowing for the inclusion of the coolant passage 119 and the groove 120, while preventing the apparatus from becoming too large.

If the heat sink 103 is made of quartz, the relative dielectric constant $\in$ r is about 6. If the heat sink 103 has no coolant passages 119 or grooves 120, the distance "c" is 240 mm based on the calculation of b* $\in$ r. Under these conditions, the dielectric constant of the entirety of the heat sink 103 can be reduced by:

(i) Making the volume of the groove 120 as large as possible within a range not adversely affecting the mechanical strength of the heat sink 103;
(ii) Using a coolant that has as low a dielectric constant as possible; and
(iii) Combining (i) and (ii).

Concerning item (i), the relative dielectric constant in the groove is about 1, and therefore, as the groove becomes large, the dielectric constant of the heat sink 103 as a whole becomes smaller. Concerning item (ii), an example of the coolant is fluorine-containing inert liquid, such as Fluorinert (manufactured and sold by Sumitomo 3M Co. Ltd.) whose dielectric constant is about 2.5. The coolant passage is located in proximity to the wafer in order to regulate the temperature of the wafer 101.

It is also necessary to make the contact area S between the bottom of the heat sink 103 and the shoulder 125 of the housing 107 small in order to reduce the parasitic capacity. However, if the contact area S is fixed small, the interface between the metallic housing and the brittle heat sink will be located very close to the boundary between the vacuum and the atmosphere. This causes the heat sink 103 to be easily breakable. To overcome this problem, a shock absorber 117 is inserted between the bottom of the heat sink 103 and the shoulder of the housing 107. In this arrangement, the parasitic capacity can be reduced without damaging the heat sink 103. Consequently, plasma can be produced uniformly above the wafer at a high density, while minimalizing the loss of RF power.

Figure 5:
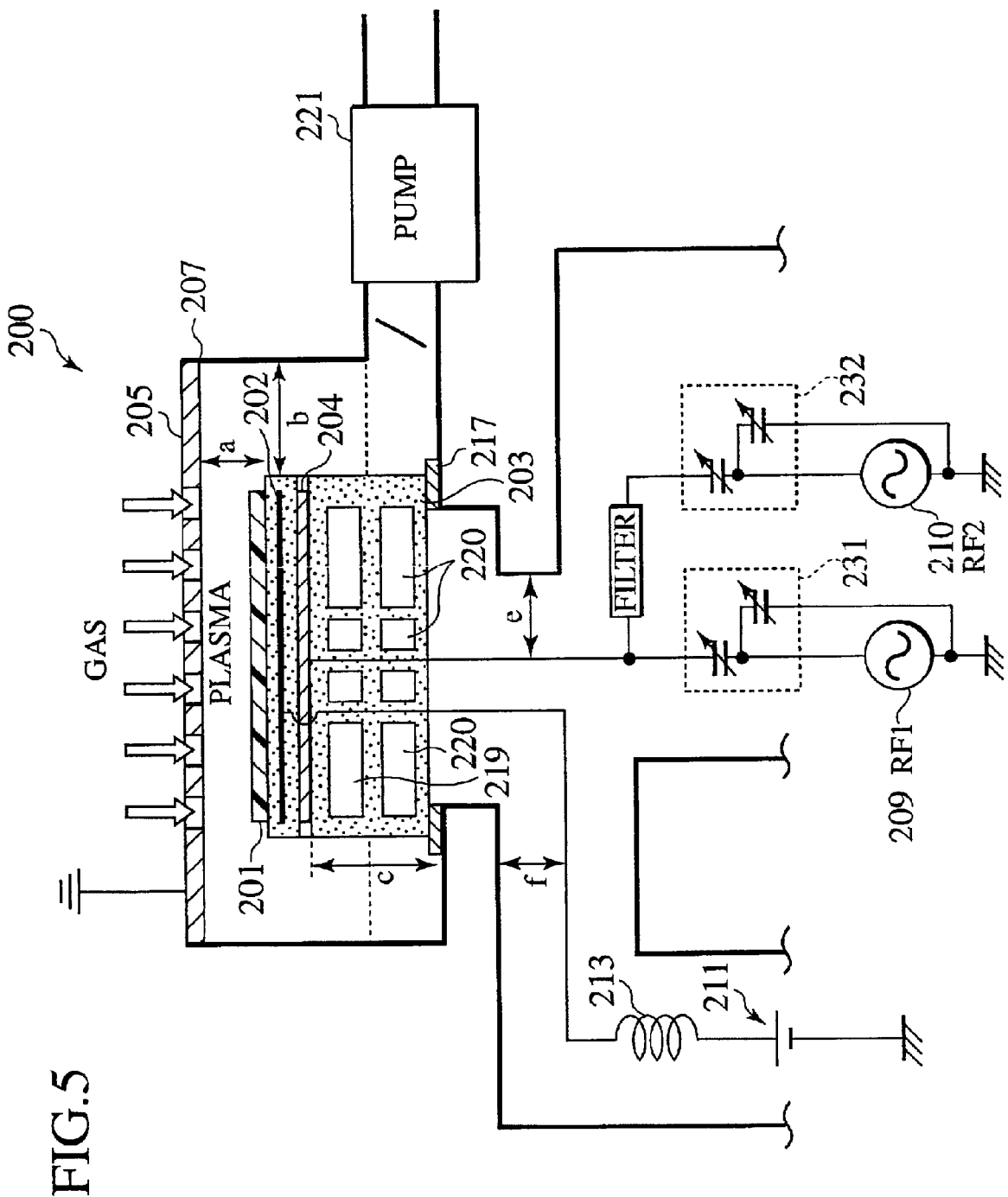
FIG. 5 illustrates a modification of the plasma processing apparatus shown in FIG. 3.

FIG. 5 illustrates a modification of the plasma processing apparatus shown in FIG. 3. In the example of FIG. 5, two RF power sources are used, and two different radio frequencies are applied to the electrode. Matching boxes 231 and 232 are also provided in parallel. The first RF power source 209 supplies a radio frequency of about 60 MHz to 100 MHz to generate plasma, and the second RF power source 210 supplies a radio frequency of about 1 MHz to adjust the ion energy. By regulating the voltages of these power sources, the plasma density and the ion energy can be balanced. To be more precise, the second RF power source 210 is regulated to control the etching rate and the pattern formation. By reducing the ion energy, the plasma processing apparatus 200 can be used for CVD, for example, filling VIA holes.

A coolant passage 219 is formed in the heat sink 203 in proximity to the wafer 201, and a groove 220 is formed so as to be as large as possible within a range that does not adversely affect the mechanical strength of the heat sink 203. The dimensions a, b, c, e, and f are selected optimally, as in the example shown in FIG. 3. The contact area (or the interface) between the heat sink 203 and the housing 207 is fixed small, and a shock absorber 217 is inserted in this portion to protect the heat sink 203. With this arrangement, both the ion energy and the plasma density are controlled simultaneously, while reducing the parasitic capacity efficiently, and highly precise plasma processing can be carried out.

Figure 6:
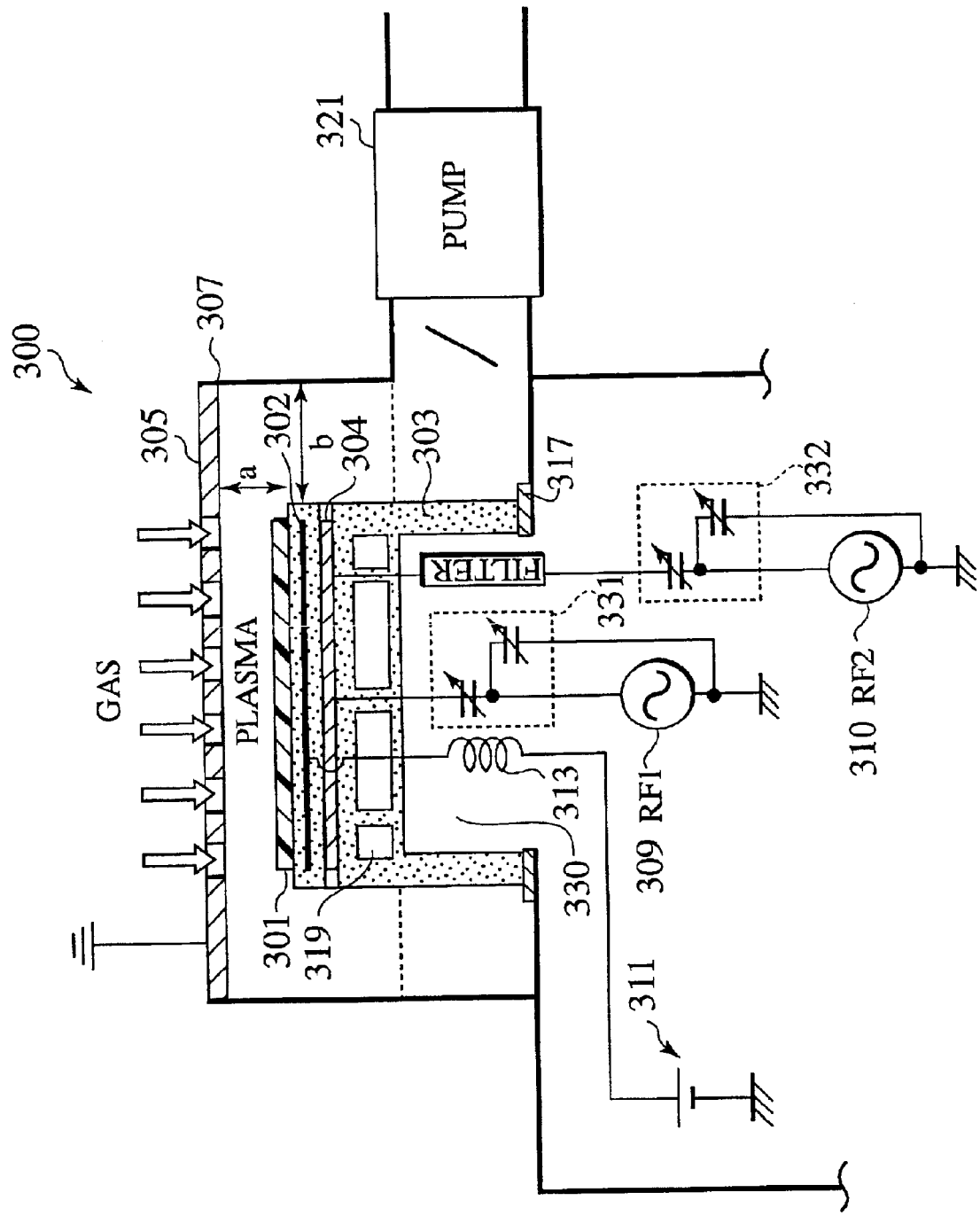
FIG. 6 illustrates another modification of the plasma processing apparatus shown in FIG. 3.

FIG. 6 illustrates another modification of the plasma processing apparatus shown in FIG. 3. In this example, a cavity 330 is formed in addition to the coolant passage 319, and the matching box 331 and a filter are accommodated in the cavity 330. The cavity 330 contributes to reducing the dielectric constant of the heat sink 303 as a whole, and consequently, the parasitic capacity of the apparatus is reduced. In addition, the cavity 330 allows the apparatus to be made compact.

The heat sink 303 is supported on the on a part of the housing 307 with a cushion 317 inserted between the heat sink 303 and the housing 307. Again, the heat sink 303 itself functions as a vacuum chuck to define a sealed space for producing plasma, while cracks or breakage of the heat sink 303 that is located at the boundary between the vacuum and the atmosphere is prevented.

<Second Embodiment>

Figure 7:
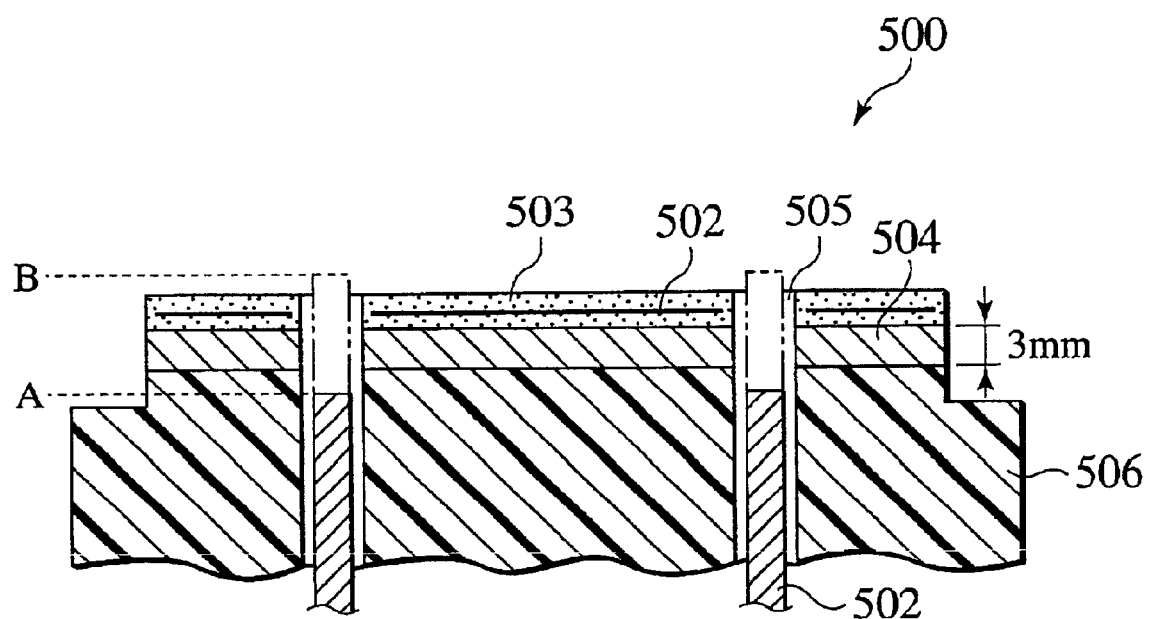
FIG. 7 illustrates the positional relationship between the wafer mount electrode and pusher pins according to the second embodiment of the invention.

FIG. 7 illustrates a wafer mount electrode 500 and pusher pins penetrating the wafer mount electrode. As has been explained above, if the plasma processing is carried out at a higher range of radio frequency, the parasitic capacity of the apparatus has to be reduced as much as possible in order to minimize the loss of RF power. The capacitive coupling between the electrode and the pusher pins is one of the more significant factors regarding the parasitic capacity in the conventional plasma processing apparatus.

Figure 2:
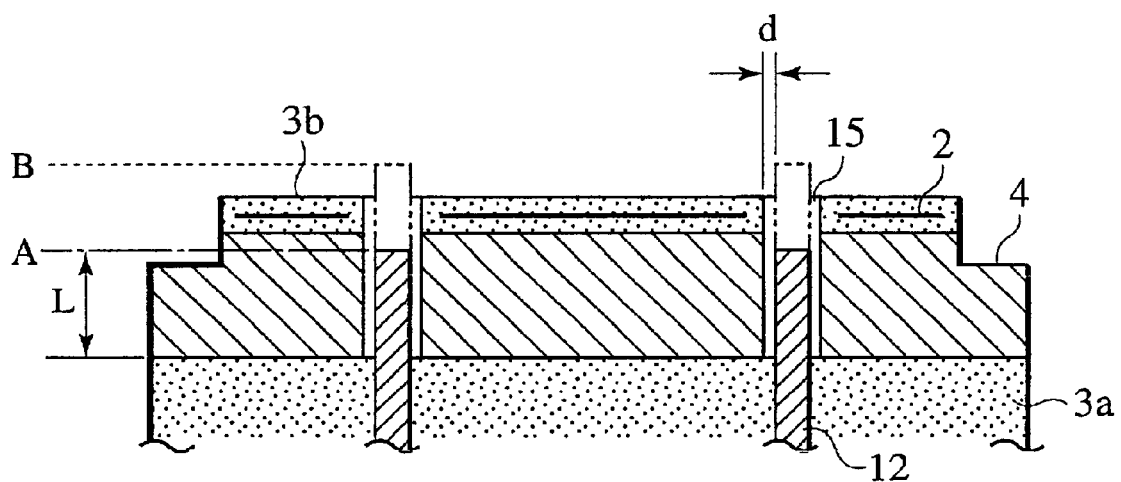
FIG. 2 illustrates the positional relationship between the wafer mount electrode and the pusher pins used in the conventional plasma processing apparatus.

In the prior art, as illustrated in FIG. 2, the pusher pins 12 are elevated in the through-holes 15 to the position B when mounting to or removing a wafer from the wafer mount electrode. During the generation of plasma, the pusher pins 12 are retracted to the position A inside the RF electrode 4 in the conventional apparatus. The loss of the RF power due to the capacitive coupling between the pusher pins 12 and the RF electrode 4 is significant, and cannot be neglected. Because the pusher pins 12 play an important role in discharging residual charges, in addition to receiving the wafer, the pins 12 cannot be replaced with insulating pins. For this reason, the parasitic capacity of the pusher pins 12 that is capacitively coupled with the RF electrode 4 has been the main cause of the loss of the RF power.

Increasing the gap d between the pusher pin 12 and the RF electrode 4 can reduce the capacitive coupling between the pusher pin and the electrode. However, the distance from the inner face of the through-hole 15 to the pusher pin 12 has to be kept to 0.8 mm or less to prevent abnormal discharge due to plasma entering into the gap. This requirement prevents the reduction of the parasitic capacity C=∈ S/d, where S is the surface area of the pusher pin 12 that faces the inner face of the through-hole 15. The area S is defined by the diameter and the height L of the pusher pin 12.

The conventional RF electrode has a thickness of about 15 mm. Meanwhile, it is desirable that the vertical stroke of the pusher pin is set small, preferably, at 8 mm or less. Accordingly, it was difficult for the conventional structure to reduce the parasitic capacity between the pusher pin and the electrode.

To overcome this problem, the wafer mount electrode 500 of the second embodiment is comprised of a thin RF plate electrode 504, and an insulating plate 506 to reinforce the RF plate electrode 504, as illustrated in FIG. 7. The thickness of the RF plate electrode 504 is 6 mm or less, and 3 mm of thickness is selected in the preferred embodiment. This arrangement efficiently prevents the pusher pin 502 from being capacitively coupled with the wafer mount electrode 500 during the generation of plasma. This wafer mount electrode can be suitably used in the plasma processing apparatuses shown in FIGS. 3, 5 and 6.

The insulating plate 506 is bonded to the RF plate electrode 504. The wafer mount side of the RF plate electrode 504 is covered with an insulator 503, and a DC plate 502 is placed inside the insulator 503 to provide an electrostatic chuck. The insulator 503 is made of the same material as the heat sink used in the plasma processing apparatuses shown in FIGS. 3, 5 and 6. The insulating plate 506 supporting the RF plate electrode 504 may be of the same material as the insulator 503, or alternatively, of a different material from the insulator 503.

The thickness of the RF plate electrode 504 of the wafer mount electrode 500 is greatly reduced, as compared with the metallic portion of the conventional wafer mount electrode. Two or more through-holes 505 are formed in the wafer mount electrode 500, and pusher pins 502 made of a conductor or semiconductor are inserted in the through-holes 505. The pusher pin 502 is driven by a driving mechanism (not shown) between the upper position B and the lower position A indicated by the dashed lines in FIG. 7. When mounting to and removing a wafer from the wafer mount electrode 500, the pusher pins 502 project out from the wafer mount electrode 500 up to position B. The pusher pins 502 are retracted to position A, and are positioned below the RF plate electrode 504 during the generation of plasma. In position A, the pusher pins 502 face the insulating plate.

Figure 8A:
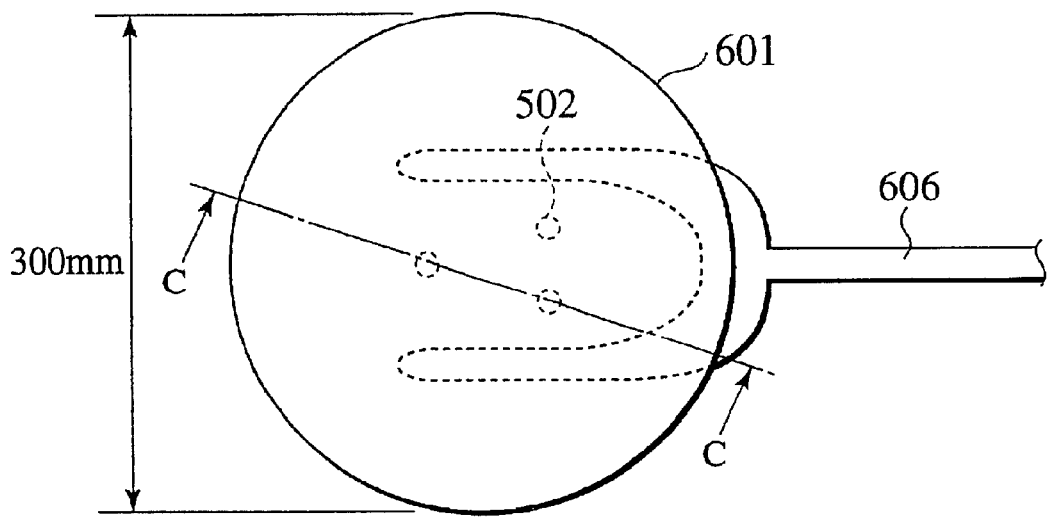
FIG. 8A is a plan view of the wafer placed on the pusher pins using a folk.
Figure 8B:
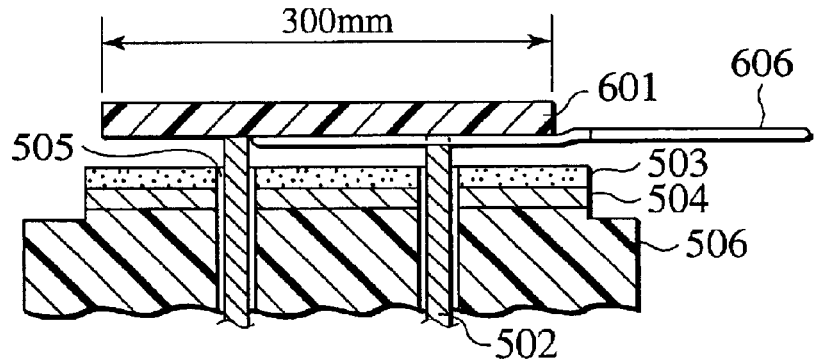
FIG. 8B is a cross-sectional view taken along the C—C line of FIG. 8A.

FIG. 8 illustrates the vertical displacement of the pusher pins 502 more clearly. A wafer 601 is placed on a fork 606 and transported into the plasma processing apparatus shown in FIG. 3, 5 or 6, as illustrated in FIG. 8A. Then, the wafer 601 is positioned over the wafer mount electrode 500. At this time, the pusher pins 502 project from the through-holes 505 and receive the wafer 601, as illustrated in FIG. 8B. Upon placing the wafer 601 onto the pusher pins 502, the fork 606 leaves the chamber (not shown).

Figure 8C:
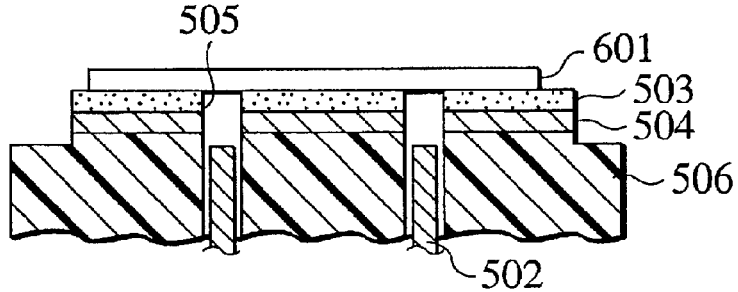
FIG. 8C is a cross-sectional view of the wafer mounted on the wafer mount electrode with the pusher pins retreated inside the insulating plate.

Then, the pusher pins 502 are retracted into the through-hole and remain below the RF plate electrode 504, as illustrated in FIG. 8C. The wafer 601 is held on the wafer mount electrode 500 in an electrostatic manner. Then, a radio frequency is applied to the RF plate electrode 504 to start plasma processing. Since the pusher pins 502 are positioned below the RF plate electrode 504 and face the insulating plate 506, capacitive coupling between the pusher pin 502 and the RF plate electrode can be avoided.

In the second embodiment, the stroke of the pusher pins 502 is only 6 mm because the thickness of the RF plate electrode is reduced to 3 mm. This means that the pusher pin 502 is distanced from the RF plate electrode 504 by about 3 mm. Consequently, the value "d" increases substantially, and the parasitic capacity between the pusher pin 502 and the RF plate electrode 504 is reduced greatly.

Preferably, the stroke of the pusher pin 502 is 8 mm or smaller. If the stroke is set to the maximum (i.e., 8 mm), the pusher pin 502 is further away from the RF plate electrode 504, and the parasitic capacity is further reduced. In any cases, it is preferable that the stroke of the pusher pins between the first and second positions is twice or more of the thickness of the RF plate electrode. Because a thin RF plate electrode 504 is used, the stroke of the pusher pin 502 can be reduced. At the same time, the pusher pin 502 retreats completely into the insulating plate 506 below the RF plate electrode 504, and the parasitic capacity between the pusher pins 502 and the electrode 504 can be eliminated during the generation of plasma. With this arrangement, the parasitic capacity C (pF) between the grounded portion of the housing and hot lines is again less than $1210*f^{-0.9}$.

Although, in the second embodiment, the thickness of the RF plate electrode 504 is set to 3 mm, any value may be selected from a range between 1 mm to 6 mm, taking into account the desired stroke and the thickness of the insulator 503 on the RF plate electrode 504. Within this range, the parasitic capacity can be reduced efficiently.

<Third Embodiment>

Figure 9:
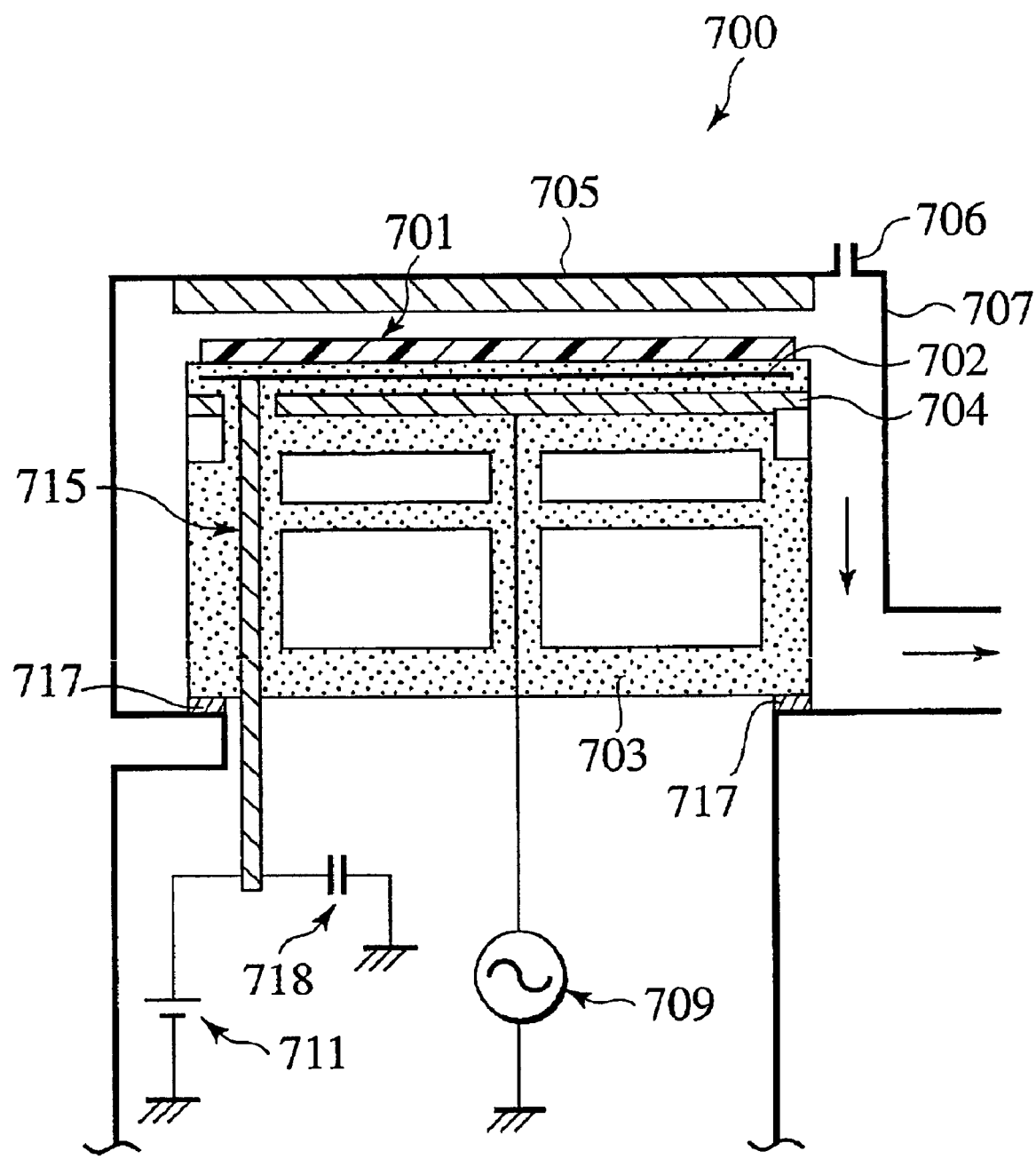
FIG. 9 illustrates a plasma processing apparatus according to the third embodiment of the invention, which uses an RF trap with an electrical length of $\lambda/4$.

FIG. 9 illustrates a parallel plate plasma processing apparatus 700 according to the third embodiment of the invention. The apparatus has a heat sink (or an insulator) 703 for mounting a wafer 701, a DC plate 702 positioned near the surface of the heat sink 703, an RF plate electrode 704 extending below the DC plate 702, and an opposite electrode 705 facing the RF plate electrode. The DC plate 702, the heat sink 703, and the RF plate electrode 704 comprise a wafer mount electrode.

The plasma processing apparatus 700 also has a DC power source 711 for applying a DC voltage to the DC plate 702 to hold a wafer 701 in an electrostatic manner, and an RF power source 709 for applying a radio frequency to the RF plate electrode 704. Plasma is produced between the RF plate electrode 704 and the opposite electrode 705 by application of the radio frequency.

The feature of the third embodiment is a radio frequency trap (referred to as an RF trap) 715 having an electrical length of ¼ of the wavelength of the applied radio frequency (e.g., 100 MHz in the third embodiment), which is inserted between the DC plate 702 and the DC power source 711. One end of the RF trap 715 is connected to the DC plate 702, and the other end is connected to a 1000 pF bypass capacitor 718 and the DC power source 711.

The RF trap 715 having an electrical length of ¼ wavelength of the applied radio frequency, prevents radio frequency from flowing into the DC power source side from the DC plate, thereby eliminating adverse affects on the DC power source 711.

For example, if the applied radio frequency is 100 MHz and the velocity is equal to the speed of light (c), the λ/4 is obtained from the following equations.

$F*\lambda=c$ $\lambda/4=c/4f=3*10^8 \text{ m}/(4*100*10^6)=0.75 \text{ m}$

In practice, the radio frequency propagates through a conductive material, and therefore, the value of λ/4 is shorter than 0.75 m. In the third embodiment, the physical length of the RF trap 715 is 27 cm. The RF trap 715 is a silver-plated copper pipe with an outer diameter of 1 cm. By using a copper pipe, the radio frequency component can be efficiently trapped without preventing the flow of the direct current applied to the DC plate 702.

The above-mentioned physical length of the RF trap 715 is determined using an oscilloscope. The oscilloscope is connected to the RF plate electrode 704, and the length of the pipe is adjusted to maximum amplitude. The physical length of 27 cm is shorter than the theoretical electrical length of λ/4 (which is v/4f, where v denotes the propagation velocity in the conductor). This is because of the parasitic capacity that exists between the hot lines and the grounded portion of the housing.

The plasma density was measured in the apparatus using the RF trap 715 of the third embodiment, and compared with that produced in the conventional apparatus.

Figure 1:
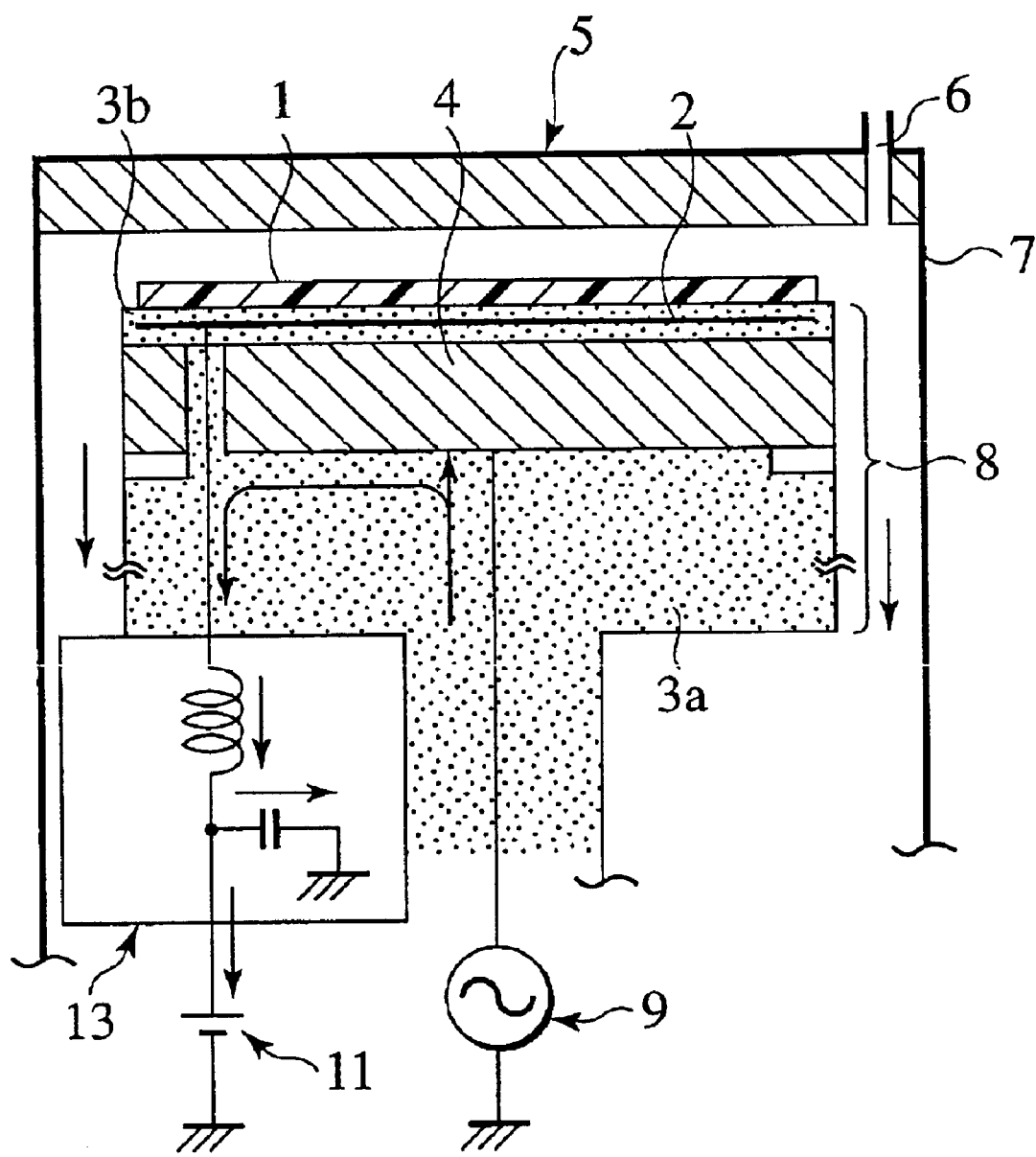
FIG. 1 illustrates a conventional plasma processing apparatus.

In the experiment, 1500V DC voltage was applied to the DC plate 2, and Ar gas was introduced from the gas port 6 into the conventional apparatus shown in FIG. 1. The pressure in the housing 7 was kept at 10 Pa. Then, 1 kW RF power was applied to the RF electrode 4 to produce plasma. The electron density of the plasma was measured by a phase interferometer for transmission microwave. The measured density was $4*10^{11} \text{ cm}^{-3}$.

The same measurement was conducted in the plasma processing apparatus 700 with the RF trap 715 under the same conditions. The measured plasma density was $5*10^{11} \text{ cm}^{-3}$. The plasma density increases by 20% in the apparatus 700 of the third embodiment, as compared to conventional apparatus. The increase in plasma density can solve the problem of the prior art, that is, the loss of RF power. In other words, the ratio of the RF energy used for generation of plasma to the entire RF energy applied to the apparatus has increased, and high-speed and high-precession plasma processing can be realized.

Although, in the third embodiment, the RF trap 715 is placed before the DC power source 711 used for electrostatic chuck, another RF trap may be positioned before another DC power source used other purposes. The RF trap 715 can be inserted in the conductive line between the RF plate electrode and the chalk coil of the plasma processing apparatus of the first embodiment (FIGS. 3, 5 and 6). In this case, the electrical length of the RF trap is again λ/4 of the applied radio frequency.

The electrical length of the RF trap is not limited to λ/4. The electrical length may be set to 3λ/4, 5λ/4, . . (2n+1)λ/4, as long as the RF trap can reflect the radio frequency component at the peak of its amplitude. By inserting the trap having these electrical lengths, the radio frequency transmitted from the wafer mount electrode is reflected off the trap and prevented from flowing into the DC power source. Because the DC power source is protected from damages, a loss of RF power is reduced. Consequently, high-density plasma is produced in the apparatus. In this case, the physical length of the radio-frequency trap is set at less than (2n+1)/4 wavelength of the applied radio frequency taking into account the parasitic capacity of the plasma processing apparatus and the inductance of transmission lines. The RF trap may be made of any good conductors, other than copper. The bypass capacitor connected in parallel to the DC power source supplies a DC voltage to the RF trap, and has sufficiently low impedance with respect to the radio frequency. The RF voltage becomes zero at the end of the RF trap connected to the bypass capacitor, and therefore, no RF voltage adversely affects the CD power source.

As has been described above, the plasma processing apparatus of the present invention is configured so that the parasitic capacity between the hot lines through which the radio frequency propagates and the grounded portion of the housing is less than $1210*f^{-0.9}$. Consequently, the plasma capacity increases relatively, and high-density plasma processing can be achieved.

A portion of the housing supports the bottom of the heat sink, and the heat sink itself functions as an electrostatic chuck. In this arrangement, a shock absorber is inserted between the heat sink and the housing, thereby preventing breakage or cracks of the heat sink at the boundary between the vacuum and the atmosphere. Thus, a compact and a safe plasma processing apparatus can be realized.

The thickness of the RF plate electrode is greatly reduced, and the positional relationship between the RF plate electrode and the pusher pins is improved so as to substantially eliminate the capacitive coupling between the RF plate electrode and the pusher pins.

The RF trap also prevents undesirable waste (or loss) of the RF power, and eliminates adverse influence to the DC power source.

The present invention is not limited to the above-described examples, and there are many possible modifications and substitutions. For example, the wafer includes any equivalent objects be processed in the plasma processing apparatus of the present invention, and the heat sink may be made of any materials that is a good insulator and a good heat radiator. Plasma processing includes not only plasma etching, but also film formation, such as CVD. The plasma processing apparatus of the present invention can also be applied to plasma ion implantation.

What is claimed is:

1. A plasma processing apparatus comprising:
   a grounded housing;
   an RF plate electrode placed in the housing;
   an opposite electrode facing the RF plate electrode; and
   an RF power source for applying a radio frequency to either the RF plate electrode or the opposite electrode to generate plasma between the two electrodes, wherein the radio frequency is 60 MHz or higher, and when the radio frequency is represented as f (MHz), a parasitic capacity C (pF) between the grounded portion of the housing and a conductive portion through which the radio frequency propagates is less than $1210*f^{-0.9}$.

2. The plasma processing apparatus of claim 1, wherein the RE late electrode has a thickness of 6 mm or less.

3. The plasma processing apparatus of claim 1, further comprising a heat sink that holds the RF plate electrode and has a coolant passage inside it.

4. The plasma processing apparatus of claim 3, wherein the heat sink further has a groove inside it.

5. The plasma processing apparatus of claim 3, wherein the heat sink is supported by a part of the housing, and a shock absorber is inserted between the heat sink and said part of the housing.

6. The plasma processing apparatus of claim 5, wherein the heat sink is made of a ceramic material and the shock absorber is a malleable insulator.

7. The plasma processing apparatus of claim 5, wherein the shock absorber is made of Teflon.

8. The plasma processing apparatus of claim 1, further comprising:
   a DC power source for supplying a direct voltage in order to hold a wafer on the RF plate electrode in an electrostatic manner; and
   a radio-frequency trap positioned between the DC power source and the RF plate electrode, the radio-frequency trap having an electrical length of 1/4 wavelength of the radio frequency applied to the electrode.

9. A plasma processing apparatus comprising:
   a housing having a shoulder;
   a heat sink configured such that a contact area between a bottom of the heat sink and the shoulder is smaller than an area of the bottom of the heat sink;
   an RF plate electrode placed on a top of the heat sink in the housing;
   an opposite electrode facing the RF plate electrode; and
   an RF power source applying a radio frequency to either the RF plate electrode or the opposite electrode to generate plasma between the two electrodes, wherein the radio frequency is 60 MHz or higher, and when the radio frequency is represented as f (MHz), a parasitic capacity (pF) between a grounded portion of the housing and a conductive portion through which the radio frequency propagates is less than $1210*f^{-0.9}$.

10. The plasma processing apparatus of claim 9, wherein the RF plate electrode as a thickness of 6 mm or less.

11. The plasma processing apparatus of claim 9, wherein the heat sink holds the plate electrode and has a coolant passage inside it.

12. The plasma processing apparatus of claim 11, wherein the heat sink further as a groove inside it.

13. The plasma processing apparatus of claim 9, wherein a shock absorber is inserted between the heat sink and said shoulder of the housing.

14. The plasma processing apparatus of claim 13, wherein the heat sink is made of a ceramic material and the shock absorber is a malleable insulator.

15. The plasma processing apparatus of claim 13, wherein the shock absorber is made of Teflon.

16. The plasma processing apparatus of claim 9, further comprising:
   a DC power source supplying a direct voltage in order to hold a wafer on the RF plate electrode in an electrostatic manner; and
   a radio-frequency trap positioned between the DC power source and the RF plate electrode, the radio-frequency trap having an electrical length of 1/4 wavelength of the radio frequency applied to the electrode.

* * * * *